United States Patent
Su et al.

(10) Patent No.: US 9,728,498 B2
(45) Date of Patent: Aug. 8, 2017

(54) PACKAGE STRUCTURE

(71) Applicant: Taiwan Semiconductor Manufacturing Co., Ltd., Hsin-Chu (TW)

(72) Inventors: An-Jhih Su, Taoyuan (TW); Hsien-Wei Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/754,705

(22) Filed: Jun. 30, 2015

(65) Prior Publication Data

US 2017/0005034 A1 Jan. 5, 2017

(51) Int. Cl.
*H01L 23/48* (2006.01)
*H01L 23/52* (2006.01)
(Continued)

(52) U.S. Cl.
CPC .... *H01L 23/49894* (2013.01); *H01L 23/3157* (2013.01); *H01L 23/49811* (2013.01);
(Continued)

(58) Field of Classification Search
CPC . H01L 2924/01079; H01L 2924/01078; H01L 2924/01013; H01L 2924/01029; H01L 2924/01022; H01L 2924/14; H01L 23/5329; H01L 23/5226; H01L 23/5222; H01L 23/481; H01L 21/76841;
(Continued)

(56) References Cited

U.S. PATENT DOCUMENTS 5,504,036 A * 4/1996 Dekker ............... H01L 21/6835
                                              148/DIG. 12
2003/0199159 A1* 10/2003 Fan ........................ H01L 24/11
                                                      438/612
(Continued)

FOREIGN PATENT DOCUMENTS

TW      201222687      6/2012
TW      201403770      1/2014

OTHER PUBLICATIONS

"Office Action of Taiwan Counterpart Application", issued on Jul. 13, 2016, p. 1-p. 7, in which the listed references were cited.

*Primary Examiner* — Teresa M Arroyo
(74) *Attorney, Agent, or Firm* — Jianq Chyun IP Office

(57) ABSTRACT

Provided is a package structure including a die, an encapsulant, a through via, a first dielectric layer, a conductive line structure, an adhesion promotion layer, a second dielectric layer and a connector. The encapsulant is formed aside the die. The through via is formed aside the die and penetrates through the encapsulant. The first dielectric layer is formed overlying the die, the encapsulant and the through via. The conductive line structure includes a pad over the first dielectric layer. The adhesion promotion layer overlays a first portion of a top surface and a sidewall of the pad and overlying the first dielectric layer. The second dielectric layer overlays the adhesion promotion layer. The connector is in contact with a second portion of the top surface of the pad. The second portion of the top surface of the pad is exposed by the adhesion promotion layer.

20 Claims, 16 Drawing Sheets

(51) Int. Cl.
H01L 29/40 (2006.01)
H01L 23/498 (2006.01)
H01L 23/31 (2006.01)
H01L 23/00 (2006.01)
H01L 23/532 (2006.01)
H01L 21/768 (2006.01)
H01L 23/522 (2006.01)

(52) U.S. Cl.
CPC .. *H01L 23/49827* (2013.01); *H01L 23/49838* (2013.01); *H01L 24/19* (2013.01); *H01L 24/20* (2013.01); *H01L 21/7685* (2013.01); *H01L 21/76841* (2013.01); *H01L 21/76852* (2013.01); *H01L 23/481* (2013.01); *H01L 23/5226* (2013.01); *H01L 23/5329* (2013.01); *H01L 2221/1073* (2013.01); *H01L 2224/04105* (2013.01); *H01L 2224/12105* (2013.01); *H01L 2224/32145* (2013.01); *H01L 2224/32225* (2013.01); *H01L 2224/48091* (2013.01); *H01L 2224/48227* (2013.01); *H01L 2224/48464* (2013.01); *H01L 2224/73265* (2013.01); *H01L 2224/73267* (2013.01); *H01L 2224/83005* (2013.01); *H01L 2224/92244* (2013.01); *H01L 2225/0651* (2013.01); *H01L 2225/06568* (2013.01); *H01L 2225/1035* (2013.01); *H01L 2225/1058* (2013.01); *H01L 2924/15311* (2013.01); *H01L 2924/181* (2013.01)

(58) Field of Classification Search
CPC ........... H01L 21/7685; H01L 21/76852; H01L 21/76871; H01L 23/3142; H01L 2221/1073; H01L 2224/48227; H01L 2224/73265; H01L 2224/32145; H01L 2224/32225; H01L 2224/48091; H01L 2224/04105; H01L 2224/12105; H01L 2224/48464; H01L 2224/73267; H01L 2224/83005; H01L 2225/0651; H01L 2225/06568; H01L 2225/1035; H01L 2225/1058; H01L 2924/00012; H01L 2924/181; H01L 2924/00014; H01L 2924/15311; H01L 23/3157; H01L 23/49811; H01L 23/49827; H01L 23/49838; H01L 23/49894; H01L 24/19; H01L 24/20; H01L 2224/92244; A23L 33/105; A23L 5/44; B01J 20/0233; B01J 20/06; B01J 20/08; B01J 20/10; B01J 20/103; B01J 20/12; B01J 20/18; B01J 39/02; B01J 39/14; C07C 2101/16; C07C 403/24; C07C 7/005; C07C 7/10; C07C 7/12; C09B 61/00
USPC .............................. 257/753, 758, 774, 781
See application file for complete search history.

(56) References Cited

U.S. PATENT DOCUMENTS

| | | | | |
|---|---|---|---|---|
| 2005/0161803 A1* | 7/2005 | Mihara | ............... | H01L 24/97 257/698 |
| 2009/0224391 A1* | 9/2009 | Lin | ............... | H01L 21/6835 257/690 |
| 2010/0140759 A1* | 6/2010 | Pagaila | ............... | H01L 21/565 257/660 |
| 2011/0062549 A1* | 3/2011 | Lin | ............... | H01L 23/3128 257/531 |
| 2012/0119379 A1* | 5/2012 | Koizumi | ............... | H01L 23/5389 257/774 |
| 2012/0187557 A1* | 7/2012 | Kyozuka | ............... | H01L 24/19 257/734 |
| 2013/0069239 A1* | 3/2013 | Kim | ............... | H01L 23/49827 257/774 |
| 2013/0077272 A1* | 3/2013 | Lin | ............... | H01L 22/32 361/760 |
| 2013/0328212 A1* | 12/2013 | Chino | ............... | H01L 23/49827 257/774 |
| 2014/0061898 A1* | 3/2014 | Chen | ............... | H01L 23/3185 257/737 |
| 2016/0049371 A1* | 2/2016 | Lee | ............... | H01L 21/76831 257/621 |

* cited by examiner

PACKAGE STRUCTURE

BACKGROUND

In recent years, the semiconductor industry has experienced rapid growth due to continuous improvement in integration density of various electronic components, e.g. transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of the type of packages for semiconductors include quad flat pack (QFP), pin grid array (PGA), ball grid array (BGA), flip chips (FC), three dimensional integrated circuits (3DICs), wafer level packages (WLPs), and package on package (PoP) devices. A grinding or polishing step is one of the main steps in a package manufacturing process. To achieve better control on the grinding uniformity of a package structure is the attention focus in the industry.

DETAILED DESCRIPTION

Figure 1A:
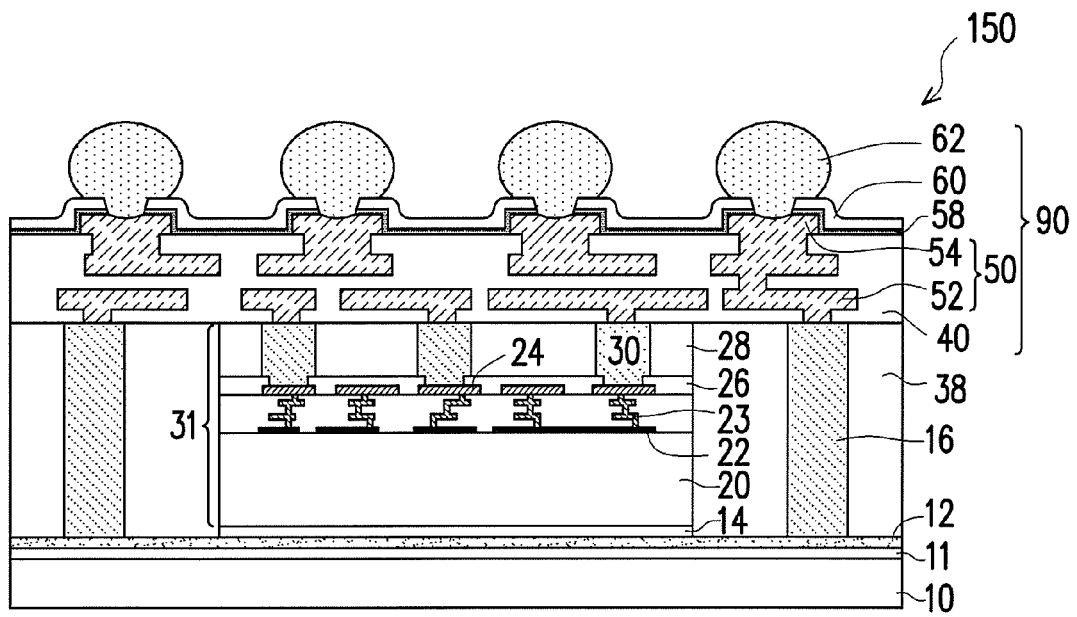
FIG. 1A and FIG. 1B are schematic cross-sectional views illustrating a method of forming a PoP device in accordance with some embodiments.

The following disclosure provides many different embodiments, or examples, for implementing different features of the provided subject matter. Specific examples of components and arrangements area described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
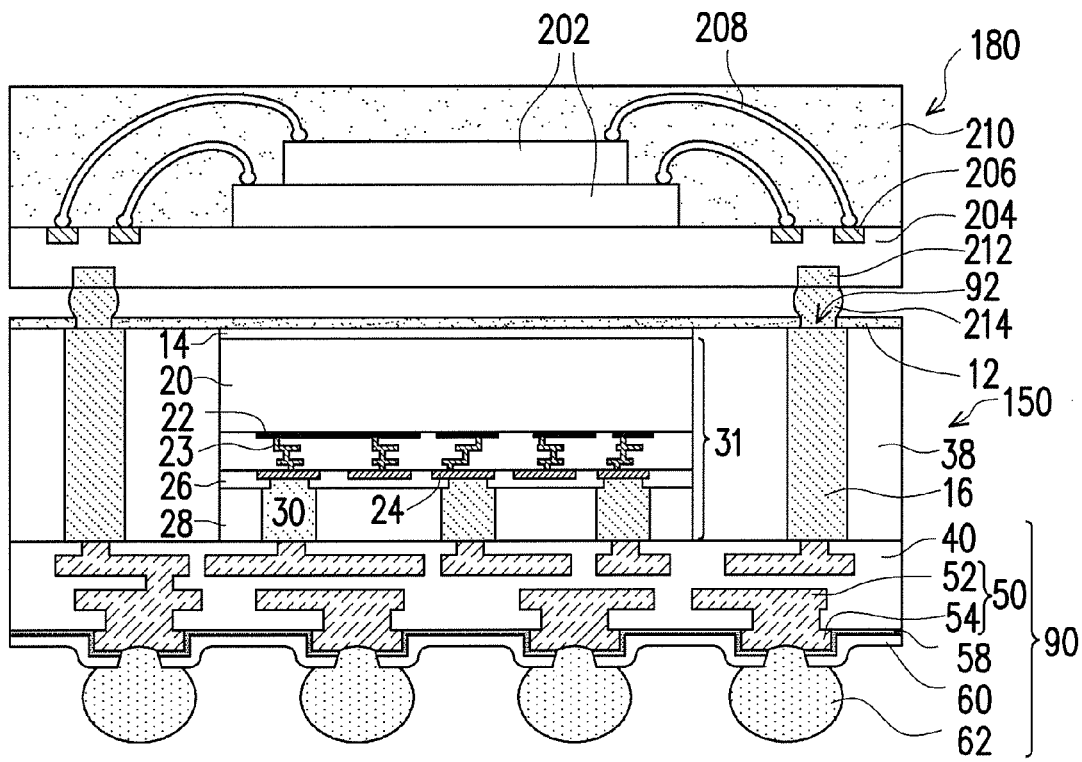

FIG. 1A to 1B are cross-sectional views of a method of forming a PoP device in accordance with some embodiments.

With reference to FIG. 1A, a die 31 is provided. In some embodiments, the die 31 includes a substrate 20, integrated circuit devices 22, an interconnect structure 23, a plurality of pads 24, a first passivation layer 26, a plurality of connectors 30 and a second passivation layer 28. The substrate 20 includes, for example, bulk silicon, doped or undoped, or an active layer of a silicon-on-insulator (SOI) substrate.

The integrated circuit devices 22 are, for example, transistors, capacitors, resistors, diodes, photodiodes, fuse elements, and similar elements. The interconnect structure 23 is formed over the integrated circuit devices 22 for connecting different integrated circuit devices 22 to form a functional circuit.

The pads 24 are formed over or on the interconnect structure 23. The pads 24 and the interconnect structure 23 are electrically connected (not shown) to provide an external connection to the integrated circuit device 22. The pad 24 includes, for example, aluminum, copper, nickel, a combination of the foregoing, or the like.

The first passivation layer 26 is formed over the substrate 20 and the pad 24. The first passivation layer 26 includes a polymer such as polybenzoxazole (PBO), polyimide, benzocyclobutene (BCB), a combination thereof or the like. The first passivation layer 26 is formed by suitable fabrication techniques such as spin-coating, lamination, deposition or the like.

The connectors 30 are formed over and electrically connected to some of the pads 24. The connectors 30 include solder bumps, gold bumps, copper bumps, copper posts or the like. The term "copper posts" refers to copper protrusions, copper through vias, thick copper pads and/or copper-containing protrusions. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

The second passivation layer 28 is formed over the first passivation layer 26 and aside the connectors 30. The second passivation layer 28 includes, for example, a polymer. The polymer includes polybenzoxazole (PBO), polyimide, benzocyclobutene (BCB), a combination thereof or the like. The second passivation layer 28 is by suitable fabrication techniques such as spin-coating, lamination, deposition or the like.

An adhesive layer 14 is formed over the back sides of the die 31. The adhesive layer 14 includes a die attach film (DAF), silver paste, or the like.

The die 31 with the adhesive layer 14 is placed over a carrier 10. The carrier 10 is provided with a glue layer 11 and a dielectric layer 12 formed thereon. The carrier 10 may be a blank glass carrier, a blank ceramic carrier, or the like. The glue layer 11 may be formed of an adhesive such as an Ultra-Violet (UV) glue, a Light-to-Heat Conversion (LTHC) glue, or the like, although other types of adhesives may be used. In some embodiments, the glue layer 11 is decomposable under the heat of light to thereby release the carrier 10 from the structure formed thereon. The dielectric layer 12 is formed over the glue layer 11. In some embodiments, the dielectric layer 12 is a polymer layer. The polymer includes, for example, polyimide, PBO, BCB, Ajinomoto Buildup Film (ABF), Solder Resist film (SR), or the like. The dielectric layer 12 is formed by suitable fabrication techniques such as spin-coating, lamination, deposition or the like.

Thereafter, a plurality of through vias 16 is formed over the carrier 10 aside or around the die 31. In some embodiments, the through vias 16 are formed over the dielectric layer 12. The through vias 16 include copper, copper alloys, nickel, solder, a combination thereof or the like. In some embodiments, the through vias 16 further include barrier layers to prevent metal diffusion. The exemplary formation method of the through vias 16 includes forming a photoresist layer such as a dry film resist over the carrier 10. Thereafter, openings are formed in the photoresist layer, and the through vias 16 are then formed in the openings by electroplating. Afterwards, the photoresist layer is stripped.

An encapsulant 38 is formed over the carrier 10 to encapsulate the die 31. In an embodiment, the encapsulant 38 includes a molding compound, a molding underfill, a resin and/or the like, such as epoxy. The encapsulant 38 is formed by suitable fabrication techniques such as spin-coating, lamination, deposition or the like. Thereafter, a grinding or polishing process is performed to remove a portion of the encapsulant 38 until the tops of the connectors 30 are exposed. In some embodiments, the encapsulant 38 includes a photo-sensitive material such as PBO, polyimide, BCB, a combination thereof or the like, which may be easily patterned using a lithography mask. In alternative embodiments, the encapsulant 38 includes a nitride such as silicon nitride, an oxide such as silicon oxide, phosphosilicate glass (PSG), borosilicate glass (BSG), boron-doped phosphosilicate glass (BPSG), a combination thereof or the like.

A connection structure 90 is formed over the die 31, the encapsulant 38 and the through vias 16. In some embodiments, the connection structure 90 includes a first dielectric layer 40, a conductive line structure 50, an adhesion promotion layer 58, a second dielectric layer 60 and a plurality of connectors 62.

The first dielectric layer 40 is formed over the encapsulant 38, the second passivation layer 28, and the connectors 30. The first dielectric layer 40 includes one or multiple layers of suitable dielectric materials. The material of the first dielectric layer 40 includes a polymer, such as polyimide, a solder resist, PBO, BCB, a combination of the foregoing, or the like. The first dielectric layer 40 is formed by spin-coating, lamination or deposition, for example. The first dielectric layer 40 may also be formed by other suitable processes.

The conductive line structure 50 is formed over and in the first dielectric layer 40. In some embodiments, the conductive line structure 50 serves as a redistribution line (RDL) layer. The conductive line structure 50 includes a plurality of traces 52 and 56 (as shown in FIG. 2D) and a plurality of pads 54. The traces 52 are formed in the first dielectric layer 40, and the pads 54 and the traces 56 are formed over the first dielectric layer 40 (see FIG. 2A to FIG. 2D). In other words, the conductive line structure 50 is electrically connected with the connector 30, and/or the through vias 16. In some embodiments, the pads 54 and the traces 52 and 56 include copper, nickel, gold, silver, aluminum, tungsten, a combination of the foregoing, or the like. In alternative embodiments, the traces 52, the pads 54, and the traces 56 are copper-containing conductive materials. The method of forming the conductive line structure 50 includes performing an electro-chemical plating process, CVD, ALD, PVD, a combination of the foregoing, or the like. In some embodiments, the method of forming the conductive line structure 50 comprises patterning a dielectric layer, forming a plug in the dielectric layer and a metal layer on the dielectric layer, and repeating the foregoing steps.

The adhesion promotion layer 58 is formed over the first dielectric layer 40 to overlay a first portion 1 of the pads 54 and the traces 56. The adhesion promotion layer 58 is a single layer or a composite layer, for example. The adhesion promotion layer 58 includes one or multiple suitable dielectric materials. In some embodiments, the adhesion promotion layer 58 includes an inorganic dielectric material such as an oxide or a nitrogen-containing dielectric material. In some embodiments, the inorganic dielectric material includes silicon oxide, silicon nitride, silicon oxynitride, a combination of the foregoing, or the like. A forming method of the adhesion promotion layer 58 includes performing a CVD or PECVD process, for example. In some embodiments, the adhesion promotion layer 58 is a conformal layer. More specifically, the adhesion promotion layer 58 is formed by disposing an adhesion promotion material layer over the pads 54, the traces 56, and the first dielectric layer 40 conformally, and then patterning the adhesion promotion material layer. In an exemplary embodiment, the thickness of the adhesion promotion layer 58 is in a range of 200 angstroms to 500 angstroms. In some embodiments, the thickness of the adhesion promotion layer 58 is about 200, 250, 300, 350, 400, 450, 500 angstroms, including any range between any two of the preceding values. The film uniformity of the adhesion promotion layer 58 is decreased when the thickness of the same is below 200 angstroms. The die is warped or deformed due to excess stress imparted by the adhesion promotion layer 58 when the thickness of the same is over 500 angstroms.

The second dielectric layer 60 is formed over the adhesion promotion layer 58. The material of the second dielectric layer 60 is different from the material of the adhesion promotion layer 58, and is the same as or different from the material of the first dielectric layer 40. The second dielectric layer 60 includes one or multiple layers of suitable dielectric materials. The second dielectric layer 60 includes one or multiple layers of suitable dielectric materials. The material of the second dielectric layer 60 includes a polymer, such as polyimide, a solder resist, polybenzoxazole (PBO), benzocyclobutene (BCB), a combination of the foregoing, or the like. The second dielectric layer 60 is formed by spin-coating, lamination or deposition, for example. The second dielectric layer 60 may also be formed by other suitable processes. The adhesion between the adhesion promotion layer 58 and the pad 54 is larger than the adhesion between the pad 54 and the second dielectric layer 60.

Connectors 62 are formed over the pads 54. The connectors 62 are conductive bumps, for example. The conductive bumps are balls, through vias, or the like, for example. The conductive bump drops into the corresponding position in ball grid array (BGA) packaging, for example. A material of the connector 62 includes a lead-free alloy (e.g. gold or a Sn/Ag/Cu alloy), a leaded alloy (e.g. a Pb/Sn alloy), copper, aluminum, aluminum copper, other bump metal materials, and/or a combination of the foregoing, for example. The package structure 150 of the present disclosure is thus completed.

With reference to FIG. 1A and FIG. 1B, in some embodiments, the glue layer 11 is decomposed under the heat of light, and the carrier 10 is then released from the package structure 150. Thereafter, the package structure 150 is turned over. One or multiple openings 92 are formed in the dielectric layer 12 by a laser drilling process, for example. The package structure 150 is further electrically coupled to a package structure 180; a PoP device is thereby obtained.

In some embodiments, the package structure 180 has a substrate 204, and a die 202 is mounted on one surface (e.g. top surface) of the substrate 204. Bonding wires 208 are used to provide electrical connections between the die 202 and pads 206 (such as bonding pads) on the same top surface of the substrate 204. Through vias (not shown) may be used to provide electrical connections between the pads 206 and pads 212 (such as bonding pads) on an opposing surface (e.g. bottom surface) of the substrate 204. Connectors 214 connect the pads 212 and fill in the openings 92 to electrically connect to the through vias 16 of the package structure 150. An encapsulant 210 is formed over the components to protect the components from the environment and external contaminants.

With reference to FIG. 1A, in brief, this disclosure provides the package structure 150. The package structure 150 includes the die 31, the encapsulant 38, the through via 16, and the connection structure 90. The connection structure 90 includes the first dielectric layer 40, the conductive line structure 50, the adhesion promotion layer 58, the second dielectric layer 60 and the connector 62. In some embodiments, the connection structure 90 is electrically connected to the die 31. In alternative embodiments, the connection structure 90 is electrically connected to the through vias 16. The adhesion promotion layer 58 promotes the adhesion between the pad 54 and the second dielectric layer 60. Thus, the connector 62 and the corresponding pad 24 are in contact with each other without an UBM layer therebetween. The adhesion promotion layer 58 protects the pad 54 and the trace 56 from being damaged in the subsequent processes such a flux dipping process, a heat treatment, a reliability test etc. Peeling, cracking and delamination often occurred in the conventional connection structures are not observed. The connection structure may be manufactured by various processes. Specific examples and configurations of the connection structure are described below.

FIG. 2A to FIG. 2D are schematic cross-sectional views illustrating a manufacturing method of a connection structure of a semiconductor device in accordance with some embodiments. FIG. 3 is a flowchart illustrating a manufacturing method of a connection structure of a semiconductor device in accordance with some embodiments.

Figure 2A:
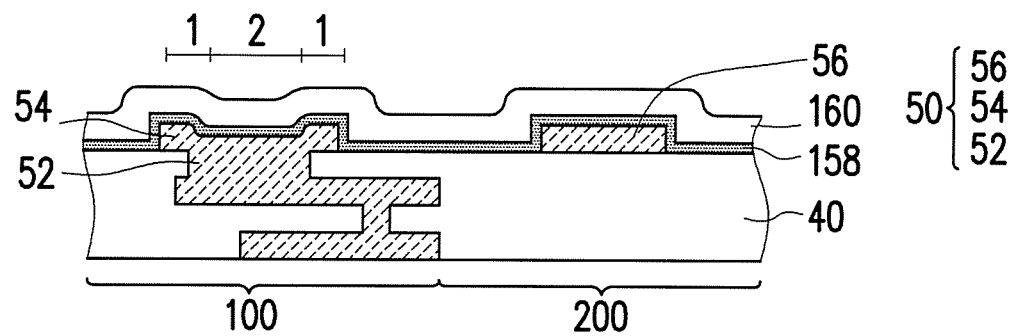
FIG. 2A to FIG. 2D are schematic cross-sectional views illustrating a manufacturing method of a connection structure of a semiconductor device in accordance with some embodiments.
Figure 3:
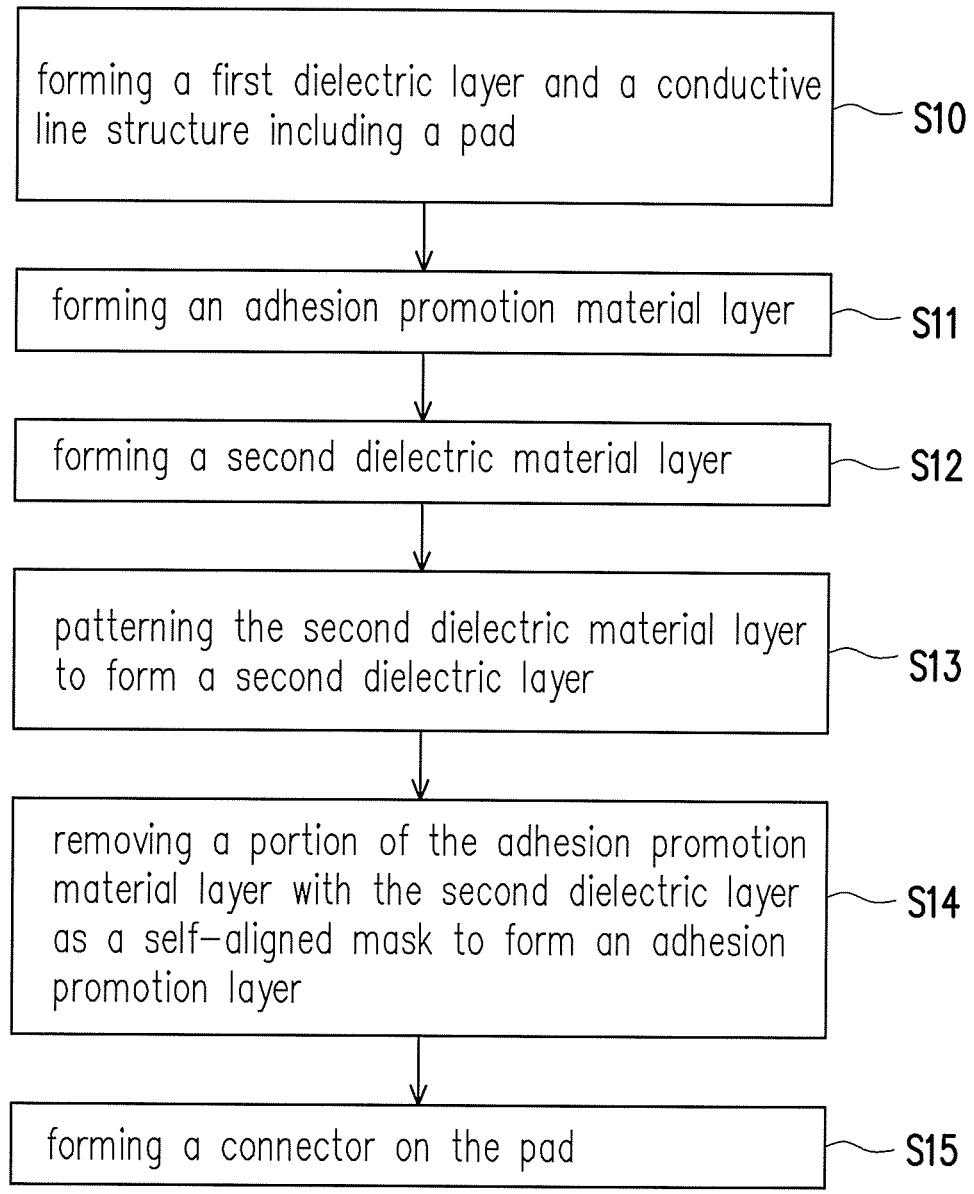
FIG. 3 is a flowchart illustrating a manufacturing method of a connection structure of a semiconductor device in accordance with some embodiments.

With reference to FIG. 2A and FIG. 3, in Step S10, a first dielectric layer 40 and a conductive line structure 50 are formed. The conductive line structure 50 includes traces 52, a pad 54 and a trace 56. The traces 52 are formed in the first dielectric layer 40. The pad 54 is formed over the first dielectric layer 40 in a first region 100 and the trace 56 is formed over the first dielectric layer 40 in a second region 200. In Step S11, an adhesion promotion material layer 158 is formed over the first dielectric layer 40, the pad 54, and the trace 56. The adhesion promotion material layer 158 is the same as the adhesion promotion layer 58 mentioned above. Thereafter, in Step S12, a second dielectric material layer 160 is formed over the adhesion promotion material layer 158. In an embodiment, the second dielectric material layer 160 includes a photosensitive material layer. The photosensitive material layer is photo-sensitive material such as polybenzoxazole (PBO), polyimide, benzocyclobutene (BCB), any combination thereof and/or the like.

Figure 2B:
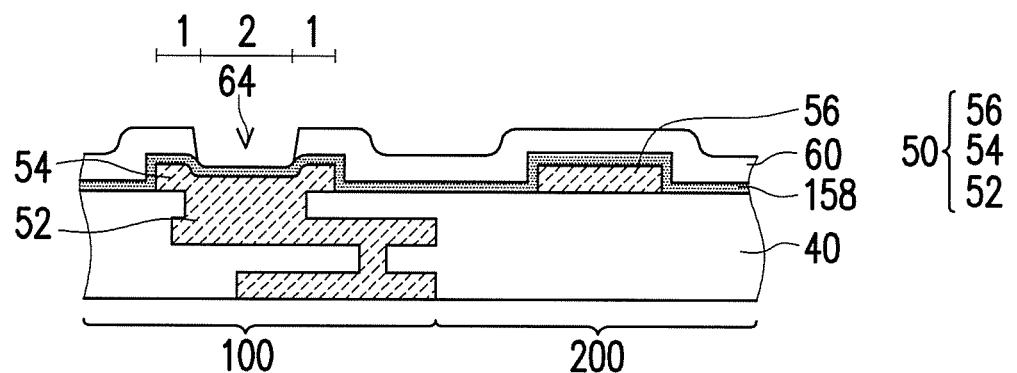

With reference to FIG. 2B and FIG. 3, in Step S13, the second dielectric material layer 160 is patterned, so as to form a patterned dielectric material layer. The patterned dielectric material layer serves as a second dielectric layer 60. The second dielectric layer 60 has the opening 64 that exposes a portion of the adhesion promotion material layer 158 over the pad 54. In some embodiments, the second dielectric material layer 160 is a photosensitive material layer, and the second dielectric material layer 160 is patterned by performing exposure and development processes.

Figure 2C:
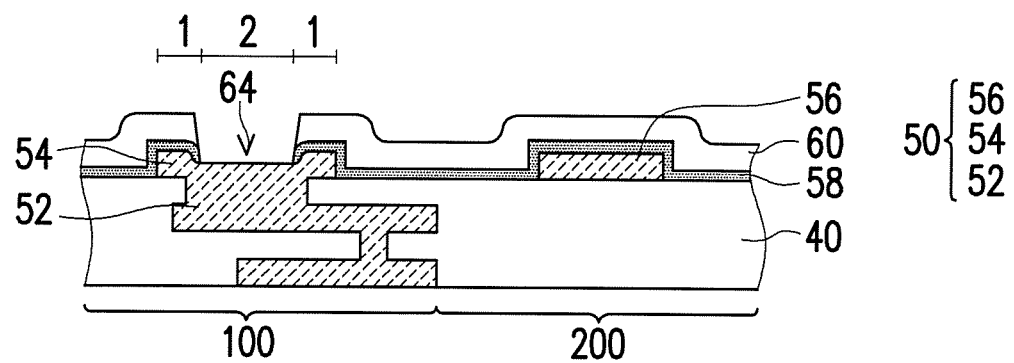
Figure 2D:
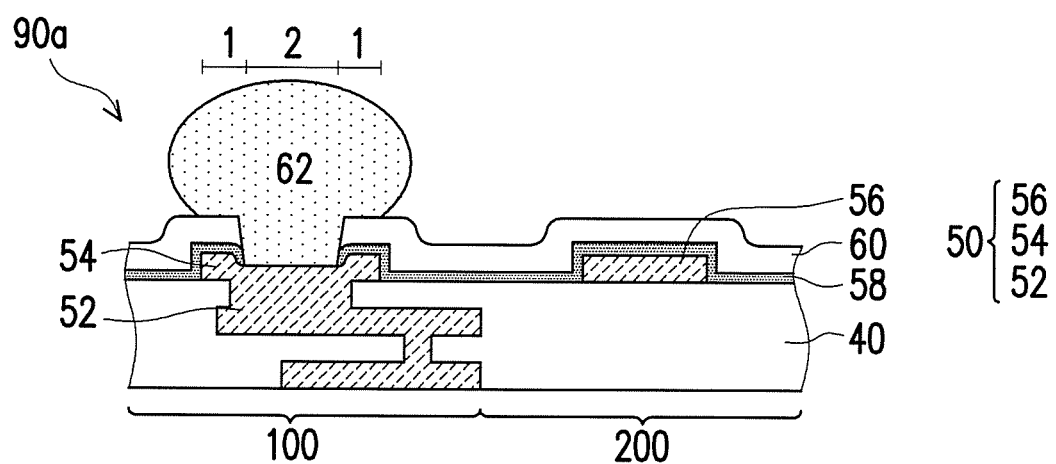

With reference to FIG. 2C and FIG. 3, in Step S14, a portion of the adhesion promotion material layer 158, which is exposed by the opening 64, over the pad 54 is removed. More specifically, the adhesion promotion material layer 158 is etched by using the second dielectric layer 60 as a self-aligned mask, so as to form an adhesion promotion layer 58.

With reference to FIG. 2D and FIG. 3, in Step S15, a connector 62 is formed on the top surface of the pad 54.

With reference to FIG. 2D, a connection structure 90a includes the first dielectric layer 40, the conductive line structure 50, the adhesion promotion layer 58, the second dielectric layer 60 and the connector 62. The conductive line structure 50 includes the traces 52, the pad 54 and the trace 56. The adhesion promotion layer 58 overlays a first portion 1 of the top surface of the pad 54, a sidewall of the pad 54, the first dielectric layer 40, and the trace 56. The adhesion promotion layer 58 is self-aligned with the second dielectric layer 60. The second dielectric layer 60 and the adhesion promotion layer 58 expose a second portion 2 of the top surface of the pad 54. The connector 62 is in contact with the second portion 2 of the top surface of the pad 54.

FIG. 4A to FIG. 4D are schematic cross-sectional views illustrating a manufacturing method of a connection structure of a semiconductor device in accordance with alternative embodiments. FIG. 5 is a flowchart illustrating a manufacturing method of a connection structure of a semiconductor device in accordance with alternative embodiments.

Figure 4A:
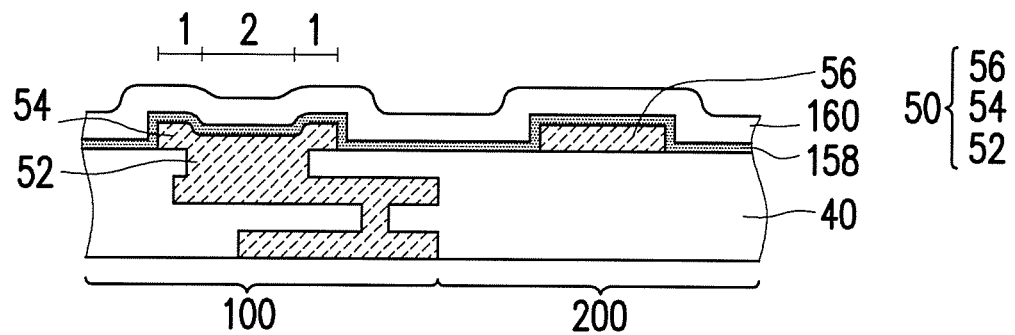
FIG. 4A to FIG. 4D are schematic cross-sectional views illustrating a manufacturing method of a connection structure of a semiconductor device in accordance with alternative embodiments.
Figure 5:
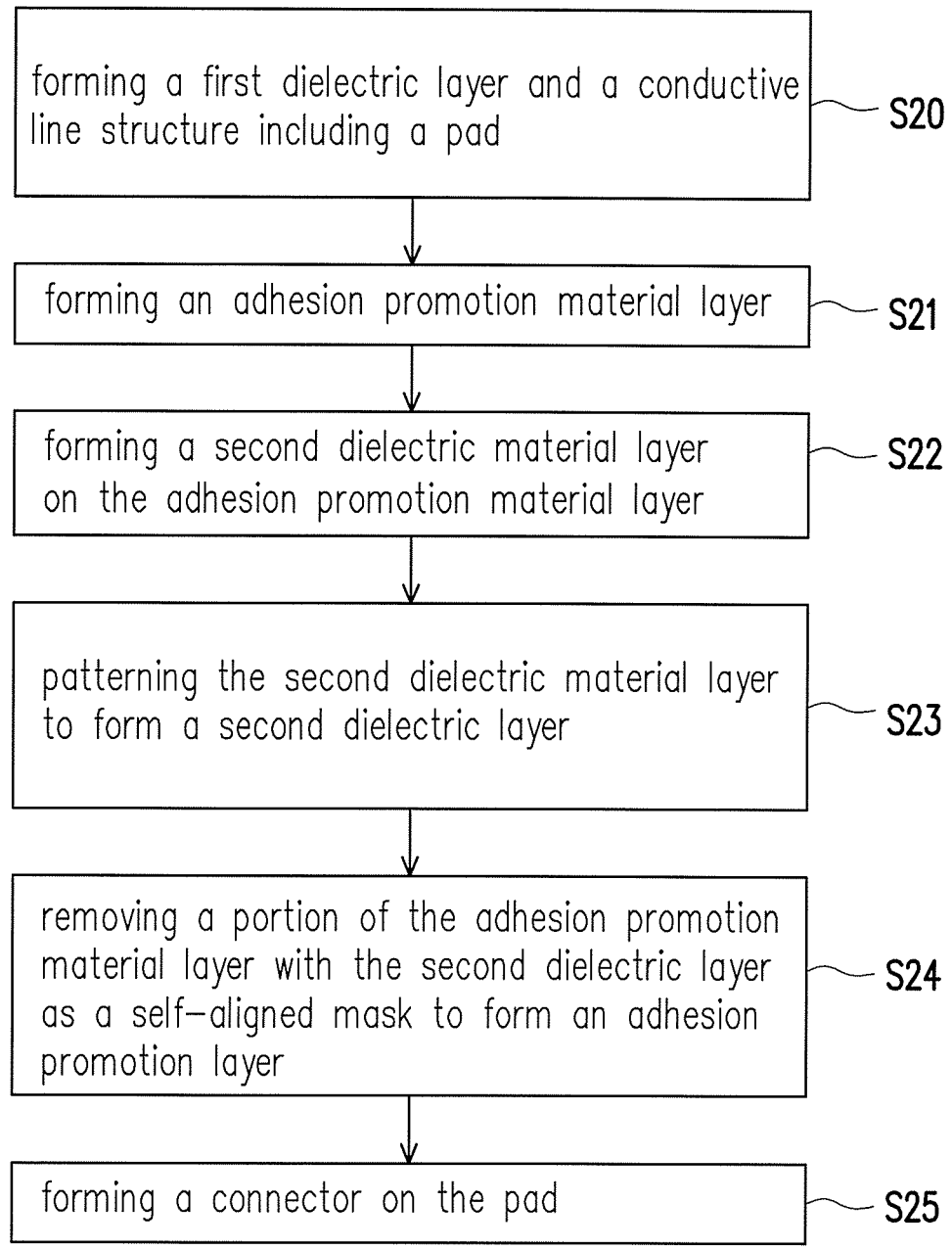
FIG. 5 is a flowchart illustrating a manufacturing method of a connection structure of a semiconductor device in accordance with alternative embodiments.

With reference to FIG. 4A and FIG. 5, a first dielectric layer 40, a conductive line structure 50, an adhesion promotion material layer 158, and a second dielectric material layer 160 are formed by performing Steps S20 through S22 in accordance with Steps S10 through S12 of the aforementioned embodiment.

Figure 4B:
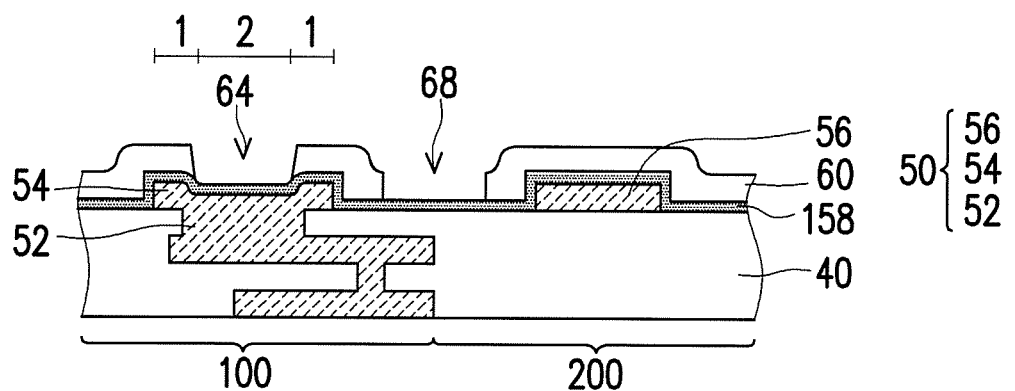

With reference to FIG. 4B and FIG. 5, in Step S23, the second dielectric material layer 160 is patterned, so as to form a second dielectric layer 60. The second dielectric layer 60 partially overlays the adhesion promotion material layer

158. The second dielectric layer 60 has an opening 64 and an opening 68. The opening 64 exposes a portion of the adhesion promotion material layer 158 over the pad 54. The opening 68 exposes a portion of the adhesion promotion material layer 158 between the pad 54 and the trace 56. In some embodiments, the second dielectric material layer 160 is a photosensitive material layer, and the second dielectric material layer 160 is patterned by performing exposure and development processes.

Figure 4C:
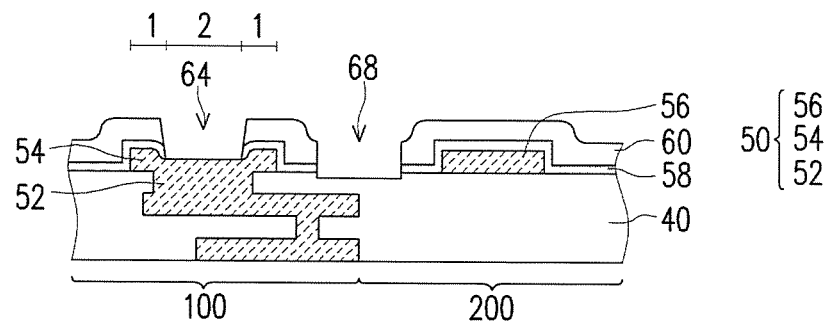

With reference to FIG. 4B, FIG. 4C and FIG. 5, in Step S24, with the second dielectric layer 60 as a self-aligned mask, a portion of the adhesion promotion material layer 158 exposed by the opening 64 and the opening 68 is removed by etching; an adhesion promotion layer 58 is thereby formed.

Figure 4D:
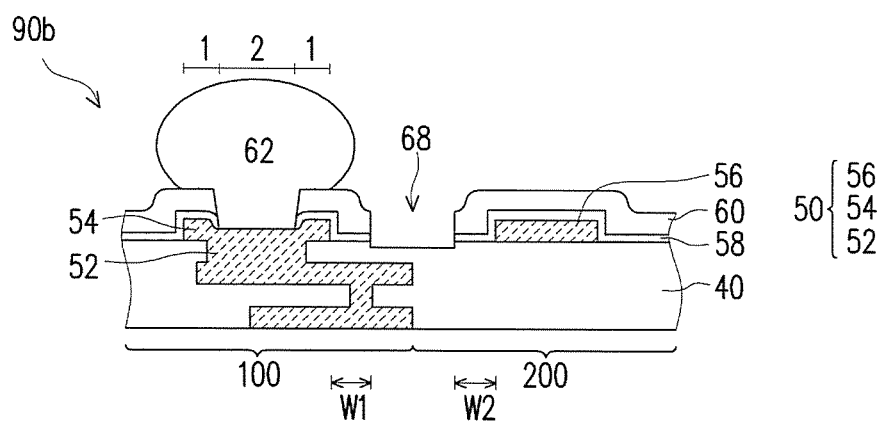

With reference to FIG. 4D and FIG. 5, in Step S25, a connector 62 is formed on the top surface of the pad 54.

With reference to FIG. 4C and FIG. 4D, a connection structure 90b includes the first dielectric layer 40, the conductive line structure 50, the adhesion promotion layer 58, the second dielectric layer 60 and the connector 62. The conductive line structure 50 includes the traces 52, the pad 54 and the trace 56. The adhesion promotion layer 58 overlays a first portion 1 of the top surface of the pad 54, a sidewall of the pad 54, a portion of the first dielectric layer 40, and the trace 56. The adhesion promotion layer 58 is self-aligned with the second dielectric layer 60. The adhesion promotion layer 58 and the second dielectric layer 60 have the openings 64 and 68. The opening 64 exposes a second portion 2 of the top surface of the pad 54. The opening 68 exposes a portion of the first dielectric layer 40 between the pad 54 and the trace 56. The width W1 of the adhesion promotion layer 58 extending from the edge of the pad 54 is about 2 μm to 20 μm. The width W2 of the adhesion promotion layer 58 extending from the edge of the trace 56 is about 2 μm to 10 μm. The connector 62 is in contact with the second portion 2 of the top surface of the pad 54.

FIG. 6A to FIG. 6F are schematic cross-sectional views illustrating a manufacturing method of a connection structure in accordance with yet another embodiment of the disclosure. FIG. 7 is a flowchart illustrating a manufacturing method of a connection structure of a semiconductor device in accordance with yet alternative embodiments.

Figure 6A:
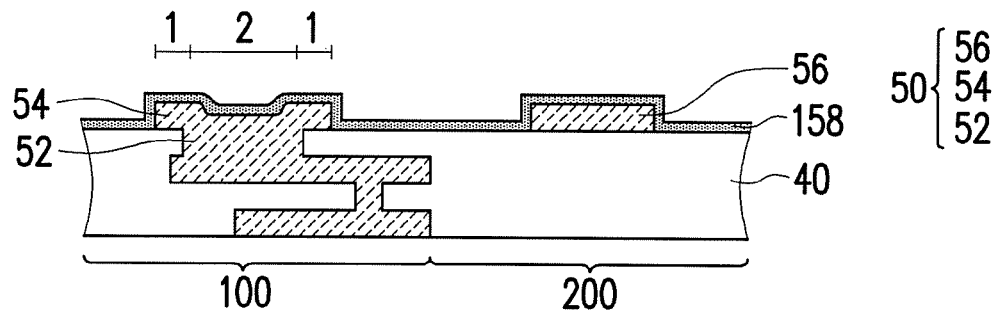
FIG. 6A to FIG. 6F are schematic cross-sectional views illustrating a manufacturing method of a connection structure of a semiconductor device in accordance with yet alternative embodiments.
Figure 7:
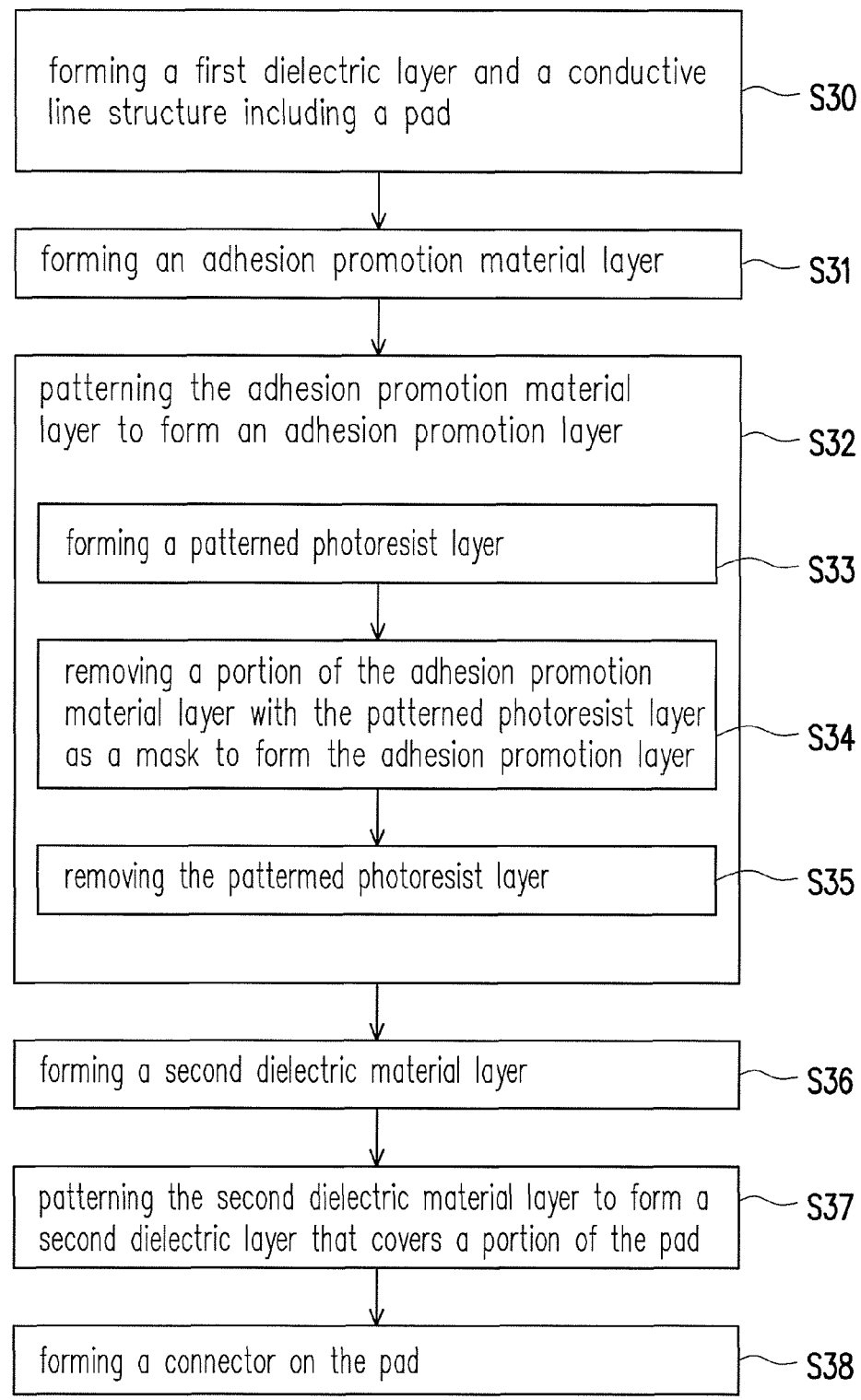
FIG. 7 is a flowchart illustrating a manufacturing method of a connection structure of a semiconductor device in accordance with yet alternative embodiments.

With reference to FIG. 6A and FIG. 7, a first dielectric layer 40, a conductive line structure 50 and an adhesion promotion material layer 158 are formed by performing Steps S30 through S31 in accordance with Steps S10 through S11 of the aforementioned embodiment.

Figure 6B:
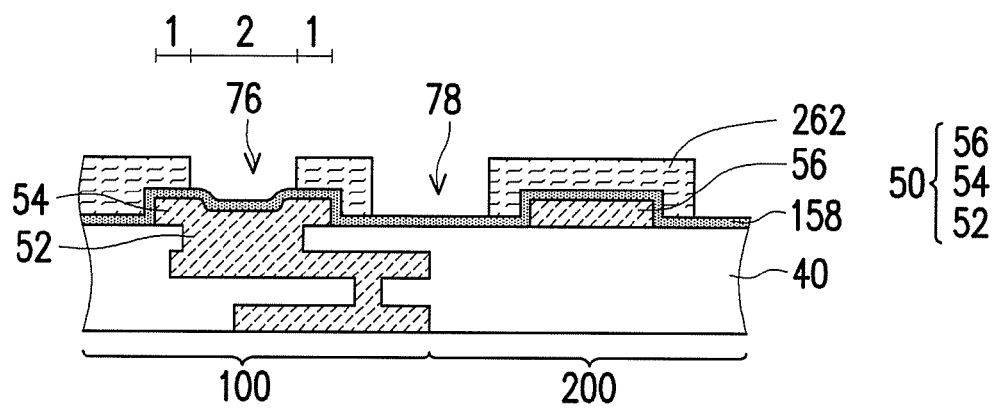
Figure 6C:
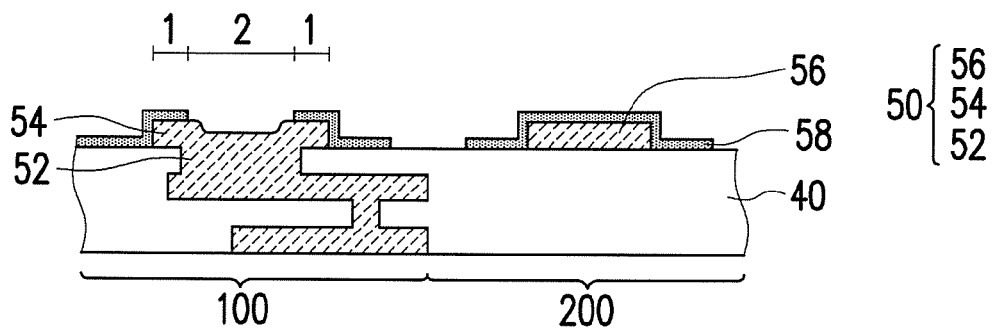

With reference to FIG. 6B, FIG. 6C, and FIG. 7, in Step S32, the adhesion promotion material layer 158 is patterned to form the adhesion promotion layer 58. Step S32 includes Step S33 through Step S35. With reference to FIG. 6B and FIG. 7, in Step S33, a patterned photoresist layer 262 is formed over the adhesion promotion material layer 158. The patterned photoresist layer 262 has an opening 76 and an opening 78. The opening 76 exposes a portion of the adhesion promotion material layer 158 over the pad 54. The opening 78 exposes the adhesion promotion material layer 158 between the pad 54 and the trace 56. With reference to FIG. 6C and FIG. 7, in Step S34, a portion of the adhesion promotion material layer 158 is removed with the patterned photoresist layer 262 as a mask to form an adhesion promotion layer 58. Thereafter, in Step S35, the patterned photoresist layer 262 is removed. The adhesion promotion layer 58 exposes a portion of the top surface of the pad 54 and exposes a portion of the first dielectric layer 40 between the pad 54 and the trace 56.

Figure 6D:
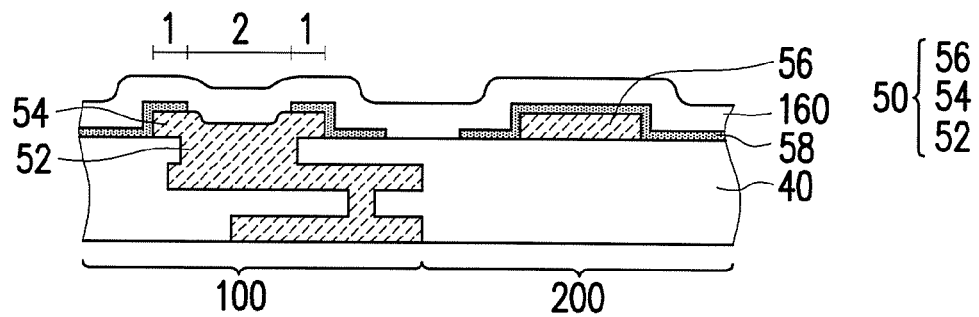

With reference to FIG. 6D and FIG. 7, in Step S36, a second dielectric material layer 160 is formed over the adhesion promotion material layer 158. In an embodiment, the second dielectric material layer 160 includes a photosensitive material layer. The photosensitive material layer is photo-sensitive material such as polybenzoxazole (PBO), polyimide, benzocyclobutene (BCB), any combination thereof and/or the like.

Figure 6E:
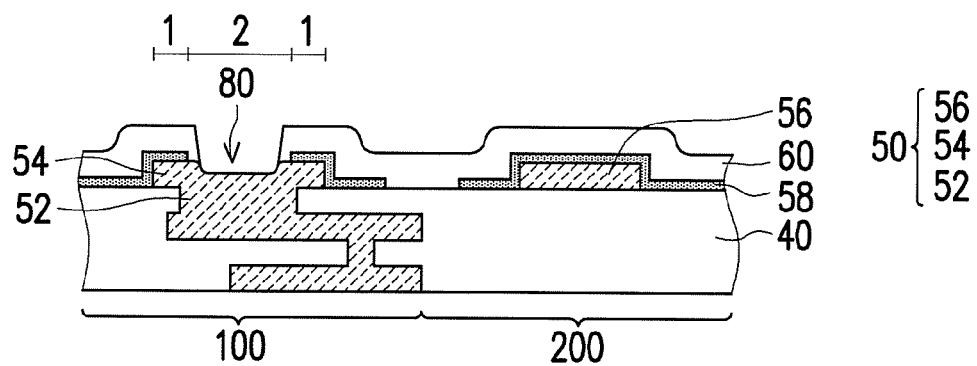

With reference to FIG. 6E and FIG. 7, in Step S37, the second dielectric material layer 160 is patterned, so as to form a second dielectric layer 60 having an opening 80 therein.

Figure 6F:
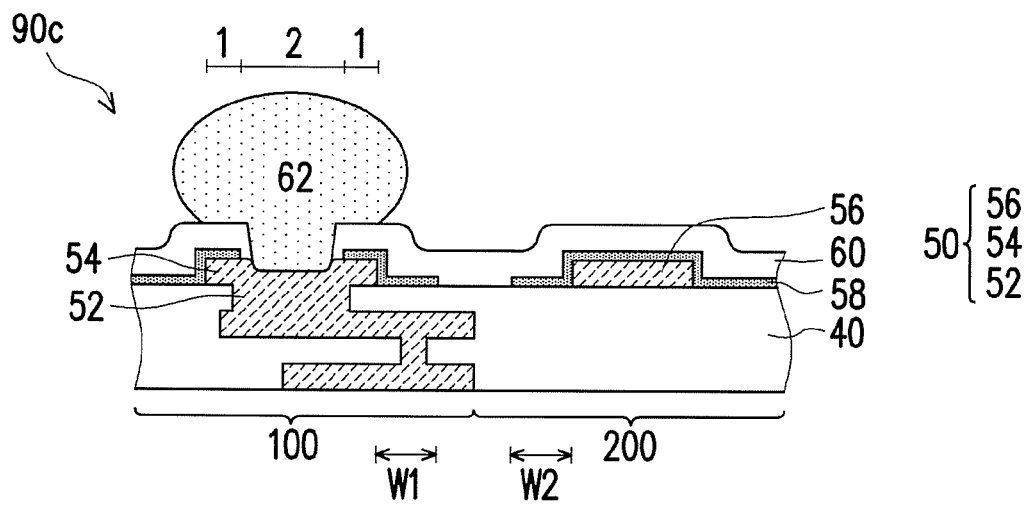

With reference to FIG. 6F and FIG. 7, in Step S38, a connector 62 is formed on the top surface of the pad 54 exposed by the opening 80.

With reference to FIG. 6F, a connection structure 90c includes the first dielectric layer 40, the conductive line structure 50, the adhesion promotion layer 58, and a second dielectric layer 60 and the connector 62. The conductive line structure 50 includes the traces 52, the pad 54 and the trace 56. The adhesion promotion layer 58 overlays a first portion 1 of the top surface of the pad 54, a sidewall of the pad 54, a portion of the first dielectric layer 40, and the trace 56. The width W1 of the adhesion promotion layer 58 extending from the edge of the pad 54 is about 2 μm to 20 μm. The width W2 of the adhesion promotion layer 58 extending from the edge of the trace 56 is about 2 μm to 10 μm. The second dielectric layer 60 partially overlays a second portion 2 of the top surface of the pad 54, and overlays the adhesion promotion layer 58 and the first dielectric layer 40 between the pad 54 and the trace 56. The second dielectric layer 60 has the opening 80 that partially exposes the second portion 2 of the top surface of the pad 54. The connector 62 is in contact with the second portion 2 of the top surface of the pad 54.

Figure 8A:
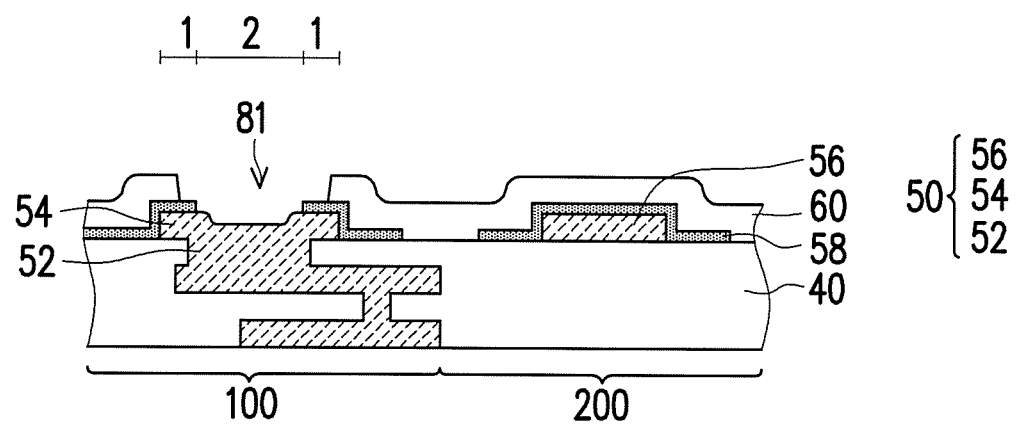
FIG. 8A to FIG. 8B are schematic cross-sectional views illustrating a manufacturing method of a connection structure of a semiconductor device in accordance with yet alternative embodiments.
Figure 8B:
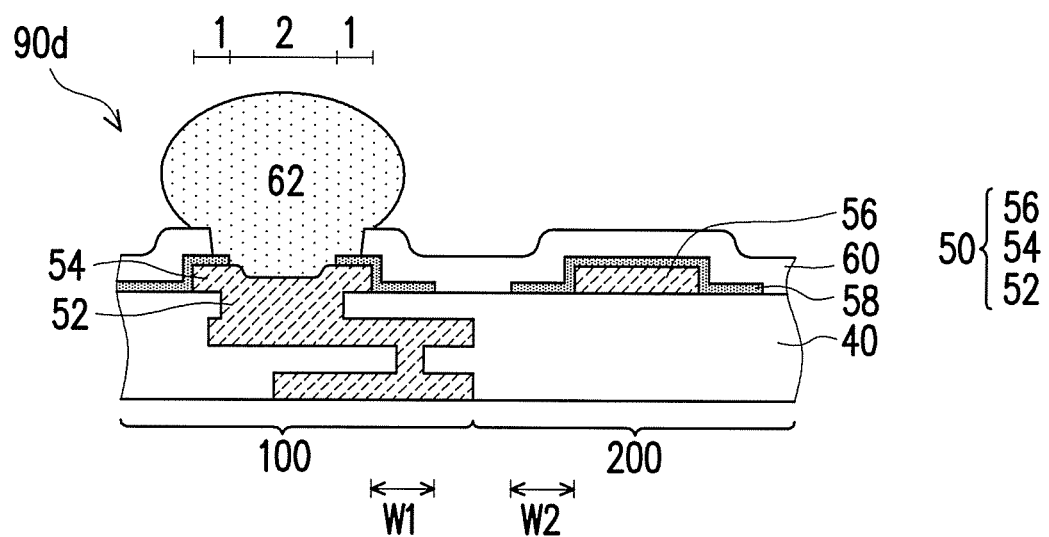
Figure 9:
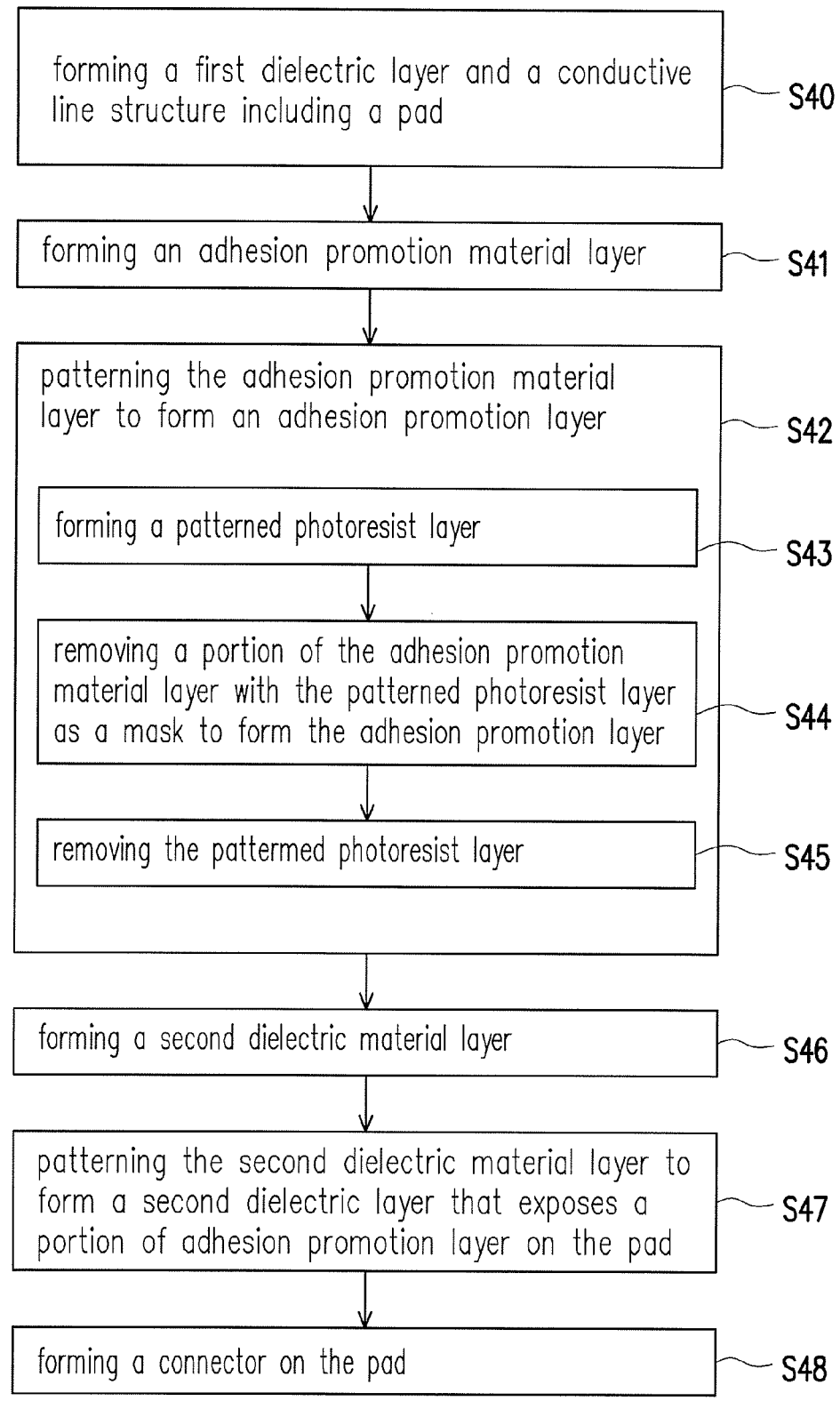
FIG. 9 is a flowchart illustrating a manufacturing method of a connection structure of a semiconductor device in accordance with yet alternative embodiments.

FIG. 8A to FIG. 8B are schematic cross-sectional views illustrating a manufacturing method of a connection structure of a semiconductor device in accordance with yet alternative embodiments. FIG. 9 is a flowchart illustrating a manufacturing method of a connection structure of a semiconductor device in accordance with yet alternative embodiments.

With reference to FIG. 6A to FIG. 6D and FIG. 9, a first dielectric layer 40, a conductive line structure 50, a pad 54, a trace 56, an adhesion promotion layer 58 and a second dielectric material layer 160 are formed by performing Steps S40 through S46 in accordance with Steps S30 through S36 of the aforementioned embodiment.

With reference to FIG. 6D, FIG. 8A and FIG. 9, in Step S47, the second dielectric material layer 160 is patterned by performing exposure and development processes, so as to form a second dielectric layer 60 having an opening 81 therein.

With reference to FIG. 8B and FIG. 9, in Step S48, a connector 62 is formed on the top surface of the pad 54.

With reference to FIG. 8B, a connection structure 90d is similar to the connection structure 90c, but the second dielectric layer 60 partially overlays the adhesion promotion layer 58 and overlays the first dielectric layer 40 between the pad 54 and the trace 56. In other words, over a first portion 1 of the top surface of the pad 54, the second dielectric layer 60 partially overlays the adhesion promotion layer 58, and partially exposes the adhesion promotion layer 58. That is, the opening 81 exposes a second portion 2 of the top surface of the pad 54 and partially exposes the adhesion promotion layer 58 over the first portion 1 of the top surface of the pas 54. The width W1 of the adhesion promotion layer 58 extending from the edge of the pad 54 is about 2 μm to 20 μm. The width W2 of the adhesion promotion layer 58 extending from the edge of the trace 56 is about 2 μm to 10 μm.

The embodiments described above illustrate an example where the second dielectric material layer 160 is a photosensitive material. In other embodiments, the second dielectric material layer 160 is a dielectric layer and is patterned by lithography and etching processes.

Figure 10:
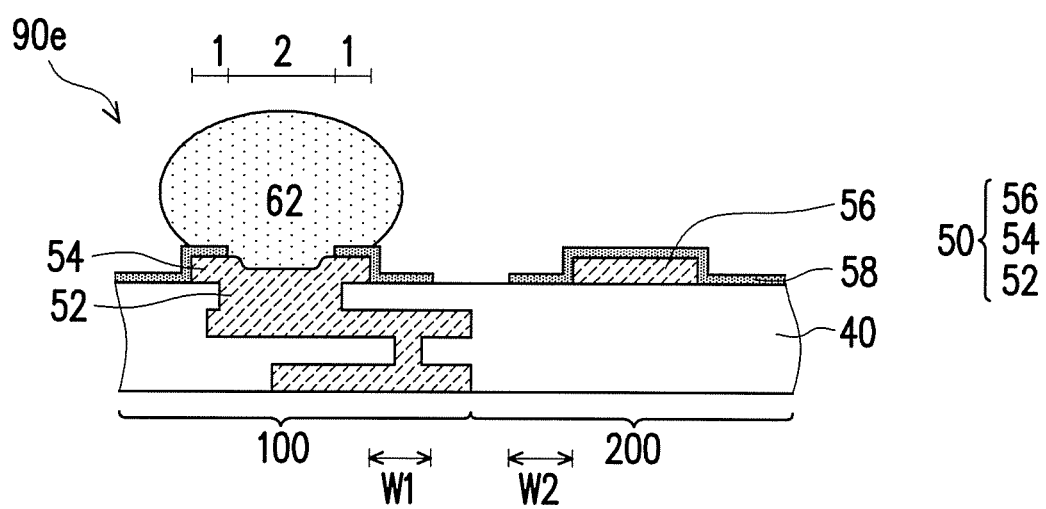
FIG. 10 is schematic cross-sectional views illustrating a connection structure of a semiconductor device in accordance with yet alternative embodiments.
Figure 11:
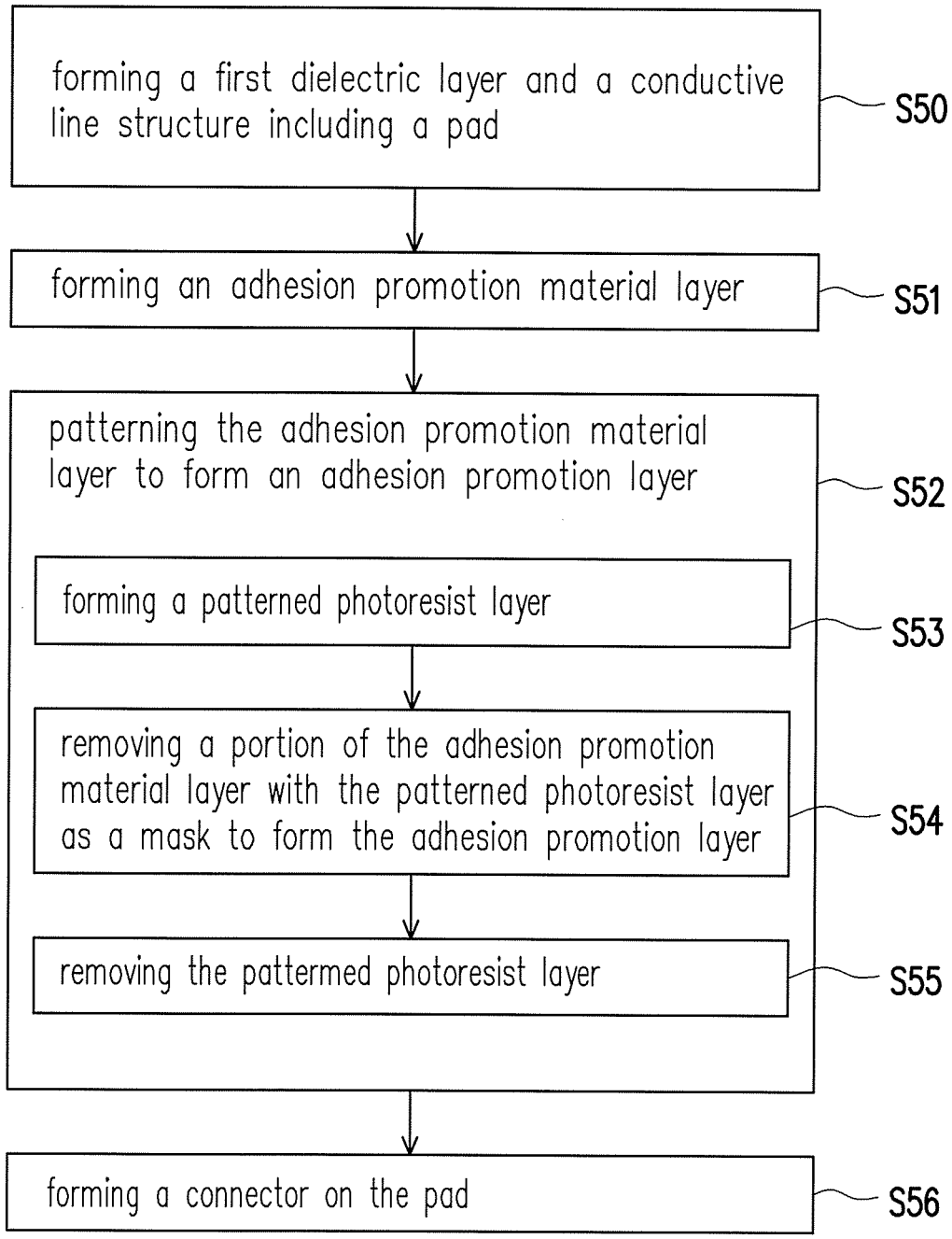
FIG. 11 is a flowchart illustrating a manufacturing method of a connection structure of a semiconductor device in accordance with yet alternative embodiments.

FIG. 10 is schematic cross-sectional views illustrating a connection structure of a semiconductor device in accordance with yet alternative embodiments. FIG. 11 is a flowchart illustrating a manufacturing method of a connection structure of a semiconductor device in accordance with yet alternative embodiments.

With reference to FIG. 6A to FIG. 6C and FIG. 11, a first dielectric layer 40, a conductive line structure 50 and an adhesion promotion layer 58 are formed by performing Steps S50 through S52 in accordance with Steps S30 through S32 of the aforementioned embodiment. With reference to FIG. 10 and FIG. 11, in Step S56, a connector 62 is formed on the top surface of the pad 54.

With reference to FIG. 10, a connection structure 90e is similar to the connection structure 90c, and the difference between them lies in that a second dielectric layer is not included in the connection structure 90e. The width W1 of the adhesion promotion layer 58 extending from the edge of the pad 54 is more than about 20 μm. The width W2 of the adhesion promotion layer 58 extending from the edge of the trace 56 is more than about 10 μm.

FIG. 12 to FIG. 15 are schematic top views illustrating connection structures of semiconductor devices in accordance with some embodiments.

Figure 12:
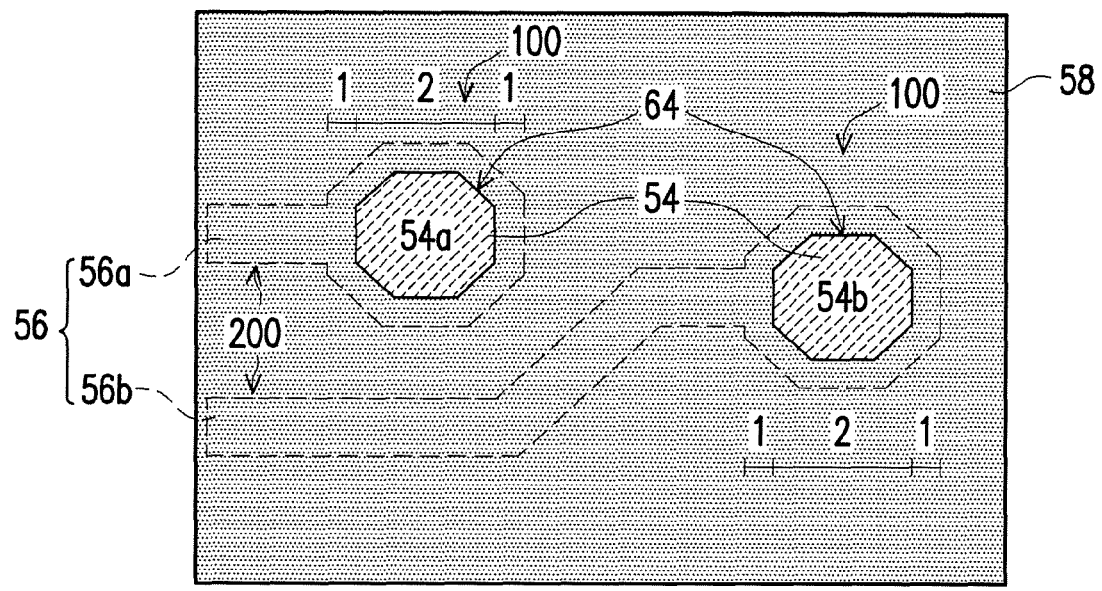
FIG. 12 to FIG. 15 are schematic top views illustrating connection structures of semiconductor devices in accordance with some embodiments.
Figure 13:
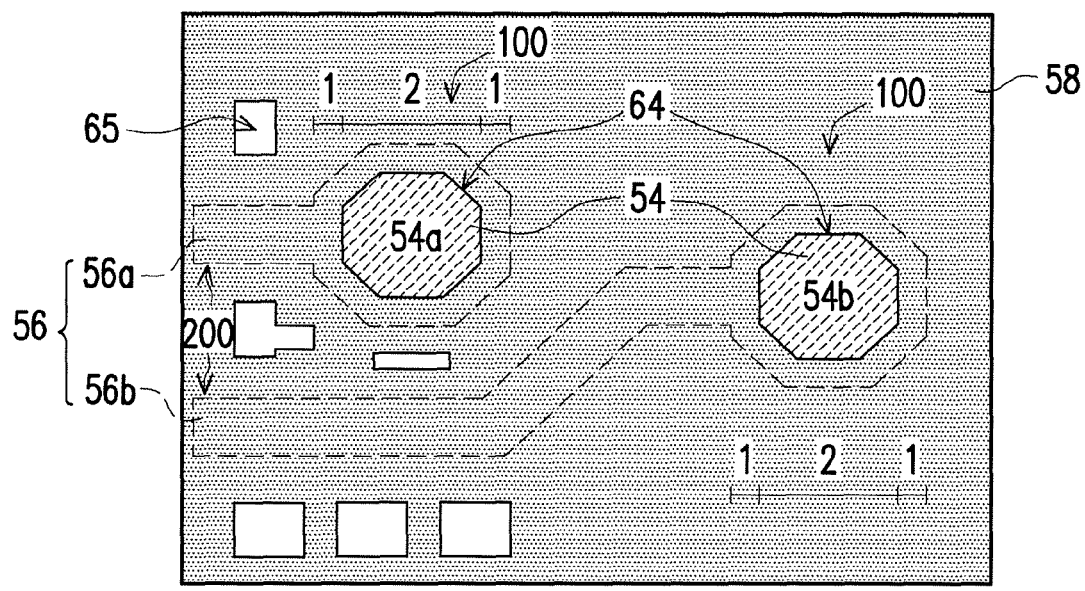
Figure 14:
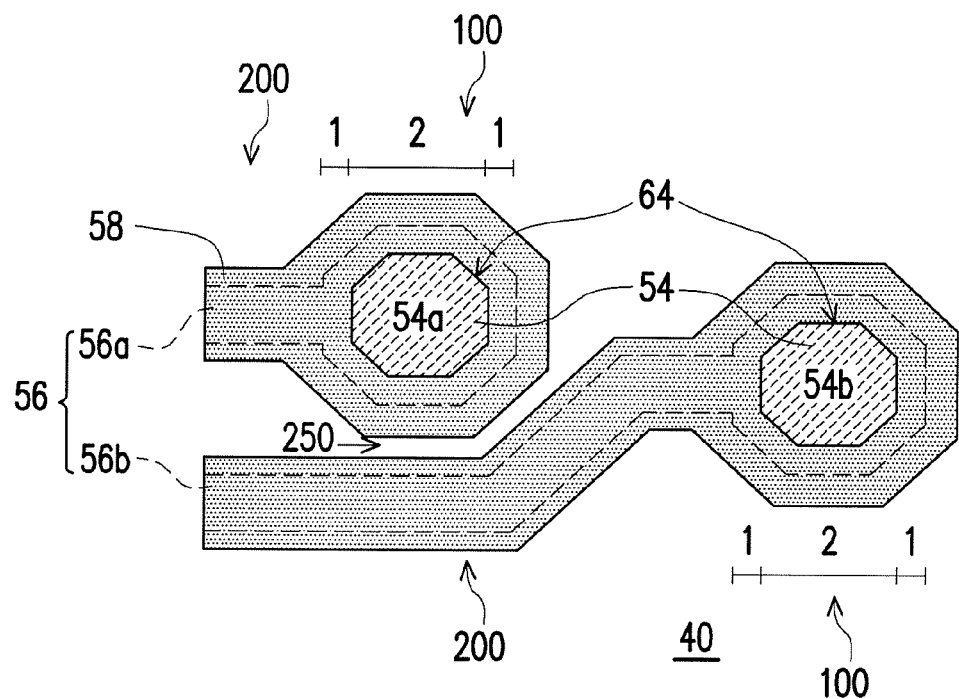
Figure 15:
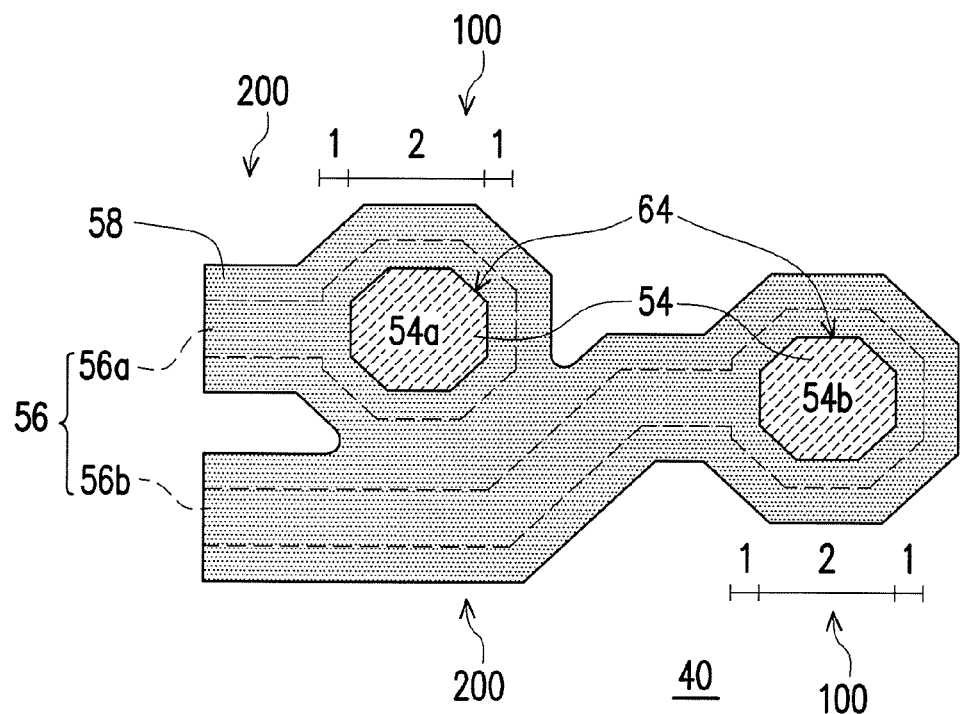

In FIG. 12 and FIG. 15, a pad 54 includes a pad 54a and a pad 54b; and traces 56 include a trace 56a and a trace 56b. The pad 54a and the trace 56a are connected with each other; and the pad 54b and the trace 56b are connected with each other. The pad 54a and the trace 56b are adjacent to each other, but not connected. In the embodiment of FIG. 12 and FIG. 13, the adhesion promotion layer 58 is similar to a blanket type layer; and in the embodiment of FIG. 14 and FIG. 15, the adhesion promotion layer 58 is a patterned layer having a contour similar to those of the pad 54a, the pad 54b, the trace 56a and the trace 56b.

With reference to FIG. 12, the adhesion promotion layer 58 is a continuous layer and extends from the pads 54a/54b to the traces 56a/56b, and is dubbed as a blanket-type layer. The adhesion promotion layer 58 overlays a first portion 1 of a top surface of the pad 54a, a first portion 1 of a top surface of the pad 54b, a top surface of the trace 56a, a top surface of the trace 56b and the top surface of the first dielectric layer 40. The adhesion promotion layer 58 has openings 64 exposing a second portion 2 of the top surface of the pad 54a and a second portion 2 of the top surface of the pad 54b.

With reference to FIG. 13, this embodiment is similar to the embodiment of FIG. 12, a difference between the two embodiments lies in that the adhesion promotion layer 58 further has at least one opening 65 in addition to the openings 64. The formation of the opening 65 reduces the overlying area of the adhesion promotion layer 58 to release the stress, thereby preventing wrapping of the package structure. In some embodiments, the opening 65 is between the trace 56a and the trace 56b, between the pad 54a and the trace 56b, and/or in any suitable position. In addition, the openings 65 have the same or different sizes and/or shapes. In an embodiment, the first dielectric layer 40 is exposed at the bottom of the opening 65. In another embodiment, the opening 65 is filled with a second dielectric layer 60.

With reference to FIG. 14, the adhesion promotion layer 58 is a patterned layer and is dubbed as a discontinuous layer. A portion of the adhesion promotion layer 58 over the pad 54a and another portion of the adhesion promotion layer 58 over the trace 56b are discontinuous. In an embodiment, the pattern of the adhesion promotion layer 58 has a contour that is similar to the contours of patterns of the pad 54a, the pad 54b, the trace 56a, and the trace 56b. Further, the adhesion promotion layer 58 does not overlay a region 250 between the pad 54a and the trace 56b adjacent to the pad 54a. In an embodiment, the region 250 is further covered by a second dielectric layer 60.

With reference to FIG. 15, this embodiment is similar to the embodiment of FIG. 14, but in this embodiment, the adhesion promotion layer 58 further overlays the first dielectric layer 40 between the pad 54a and the trace 56b. In other words, a portion of the adhesion promotion layer 58 over the pad 54a and another portion of the trace 56b are continuous.

In some embodiments, besides the adhesion promotion layer 58 being a patterned layer similar to that in the embodiments of FIG. 14 and FIG. 15, the adhesion promotion layer 58 is further formed over the first dielectric layer 40 in a suitable region, so as to evenly distribute the stress across the package structure.

In the embodiments of the disclosure, the adhesion between the pad and the second dielectric layer is improved by the formation of the adhesion promotion layer. The connector is in contact with the pad without an UBM layer therebetween. The adhesion promotion layer protects the pads and the traces from being damaged in the subsequent processes such a flux dipping process, a heat treatment, a reliability test etc. Peeling, cracking and delamination often occurred in the conventional connection structures are not observed.

In accordance with some embodiments of the present disclosure, a package structure includes a die, an encapsulant, a through via, a first dielectric layer, a conductive line structure, an adhesion promotion layer, a second dielectric layer and a connector. The encapsulant is formed aside the die. The through via is formed aside the die and penetrates through the encapsulant. The first dielectric layer is formed overlying the die, the encapsulant and the through via. The conductive line structure includes a pad over the first dielectric layer. The adhesion promotion layer overlays a first portion of a top surface and a sidewall of the pad and overlying the first dielectric layer. The second dielectric layer overlays the adhesion promotion layer. The connector is in contact with a second portion of the top surface of the pad. The second portion of the top surface of the pad is exposed by the adhesion promotion layer.

In accordance with alternative embodiments of the present disclosure, a package structure includes a die, an encapsulant, a through via, a first dielectric layer, a conductive line structure, an adhesion promotion layer, a second dielectric layer and a connector. The encapsulant is formed aside the die. The through via is formed aside the die and penetrates through the encapsulant. The first dielectric layer is formed overlying the die, the encapsulant and the through via. The conductive line structure includes a pad and a trace over the first dielectric layer. The adhesion promotion layer overlays the trace, a first portion of a top surface and a sidewall of the pad and partially overlying the first dielectric layer. The second dielectric layer overlays the adhesion promotion layer. The second dielectric layer and the adhesion promotion layer have an opening that exposes a portion of the first dielectric layer between the pad and the trace. The connector is in contact with a second portion of the top surface of the pad, wherein the second portion of the top surface of the pad is exposed by the adhesion promotion layer.

In accordance with yet alternative embodiments of the present disclosure, a package structure includes a die, an encapsulant, a through via, a first dielectric layer, a conductive line structure, an adhesion promotion layer and a connector. The encapsulant is aside the die. The through via is formed aside the die and penetrates through the encapsulant. The first dielectric layer is formed overlying the die, the encapsulant and the through via. The conductive line structure includes a pad and a trace over the first dielectric layer. The adhesion promotion layer overlays the trace, a first portion of a top surface and a sidewall of the pad and partially overlying the first dielectric layer, wherein a material of the adhesion promotion layer is different from a material of the first dielectric layer. The connector is in contact with a second portion of the top surface of the pad, wherein the second portion of the top surface of the pad is exposed by the adhesion promotion layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
    a die;
    an encapsulant aside the die;
    a through via aside the die penetrating through the encapsulant;
    a first dielectric layer overlying the die, the encapsulant and overlapping the through via;
    a conductive line structure comprising a pad over the first dielectric layer;
    an adhesion promotion layer overlying a first portion of a top surface of the pad and along a periphery of the pad, overlying a sidewall of the pad and overlying the first dielectric layer;
    a second dielectric layer overlying the adhesion promotion layer, wherein the adhesion promotion layer has an opening and a portion of the second dielectric layer disposed within the opening of the adhesion promotion layer is in contact with the underlying first dielectric layer; and
    a connector being in contact with a second portion of the top surface of the pad, wherein the second portion of the top surface of the pad is exposed by the adhesion promotion layer.

2. The package structure according to claim 1, wherein the adhesion promotion layer is self-aligned with the second dielectric layer.

3. The package structure according to claim 1, wherein the second dielectric layer further partially overlays the second portion of the top surface of the pad.

4. The package structure according to claim 1, wherein the second dielectric layer partially exposes the adhesion promotion layer over the first portion of the top surface of the pad.

5. The package structure according to claim 1, wherein an adhesion between the adhesion promotion layer and the pad and between the adhesion promotion layer and the second dielectric layer is larger than an adhesion between the pad and the second dielectric layer.

6. The package structure according to claim 1, wherein the adhesion promotion layer comprises an inorganic dielectric material.

7. The package structure according to claim 6, wherein the adhesion promotion layer comprises one of an oxide, a nitrogen-containing dielectric material, or a combination thereof.

8. The package structure according to claim 1, wherein the conductive line structure further comprises a trace on the first dielectric layer, and the adhesion promotion layer further overlays the trace.

9. A package structure, comprising:
    a die;
    an encapsulant aside the die;
    a through via aside the die penetrating through the encapsulant;
    a first dielectric layer overlying the die, and overlapping the through via and the encapsulant;
    a conductive line structure comprising a pad and a trace over the first dielectric layer;
    an adhesion promotion layer overlying the trace, a first portion of a top surface and a sidewall of the pad and partially overlying the first dielectric layer, wherein a contour of the adhesion promotion layer overlying the first portion of the top surface of the pad is in agreement with a periphery of the pad;
    a second dielectric layer overlying the adhesion promotion layer, wherein the second dielectric layer and the adhesion promotion layer have an opening that exposes a portion of the first dielectric layer between the pad and the trace; and
    a connector being in contact with a second portion of the top surface of the pad, wherein the second portion of the top surface of the pad is exposed by the adhesion promotion layer.

10. The package structure according to claim 9, wherein the adhesion promotion layer is self-aligned with the second dielectric layer.

11. The package structure according to claim 9, wherein an adhesion between the adhesion promotion layer and the pad and between the adhesion promotion layer and the second dielectric layer is larger than an adhesion between the pad and the second dielectric layer.

12. The package structure according to claim 9, wherein the adhesion promotion layer comprises an inorganic dielectric material.

13. The package structure according to claim 12, wherein the adhesion promotion layer comprises one of an oxide, a nitrogen-containing dielectric material, or a combination thereof.

14. The package structure according to claim 12, wherein the inorganic dielectric material comprises one of silicon oxide, silicon nitride, silicon oxynitride, or a combination thereof.

15. A package structure, comprising:
    a die;
    an encapsulant aside the die;

a through via aside the die penetrating through the encapsulant;

a first dielectric layer overlying the die, the through via and the encapsulant;

a conductive line structure comprising a pad and a trace over the first dielectric layer;

an adhesion promotion layer overlying the trace, a first portion of a top surface and a sidewall of the pad and partially overlying the first dielectric layer, wherein the adhesion promotion layer has an opening that exposes a portion of the first dielectric layer between the pad and the trace and a contour of the adhesion promotion layer overlying the first portion of the top surface of the pad is in agreement with a periphery of the pad, and a material of the adhesion promotion layer is different from a material of the first dielectric layer; and a connector being in contact with a second portion of the top surface of the pad, wherein the second portion of the top surface of the pad is exposed by the adhesion promotion layer.

16. The package structure according to claim 15, wherein the adhesion promotion layer is a continuous layer from the pad to the trace.

17. The package structure according to claim 15, wherein the adhesion promotion layer is a patterned layer, and the adhesion promotion layer overlying the trace extends beyond an edge of the trace.

18. The package structure according to claim 15, wherein the adhesion promotion layer comprises an inorganic dielectric material.

19. The package structure according to claim 18, wherein the adhesion promotion layer comprises one of an oxide, a nitrogen-containing dielectric material, or a combination thereof.

20. The package structure according to claim 18, wherein the inorganic dielectric material comprises one of silicon oxide, silicon nitride, silicon oxynitride, or a combination thereof.

* * * * *